(12) United States Patent
Koehler et al.

(10) Patent No.: US 9,331,163 B2
(45) Date of Patent: May 3, 2016

(54) TRANSISTOR WITH DIAMOND GATE

(71) Applicants: Andrew D. Koehler, Alexandria, VA (US); Travis J. Anderson, Alexandria, VA (US); Marko J. Tadjer, Springfield, VA (US); Tatyana I. Feygelson, Springfield, VA (US); Karl D. Hobart, Alexandria, VA (US)

(72) Inventors: Andrew D. Koehler, Alexandria, VA (US); Travis J. Anderson, Alexandria, VA (US); Marko J. Tadjer, Springfield, VA (US); Tatyana I. Feygelson, Springfield, VA (US); Karl D. Hobart, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/471,310

(22) Filed: Aug. 28, 2014

(65) Prior Publication Data
US 2015/0060947 A1   Mar. 5, 2015

Related U.S. Application Data

(60) Provisional application No. 61/872,017, filed on Aug. 30, 2013.

(51) Int. Cl.
| | |
|---|---|
| *H01L 29/43* | (2006.01) |
| *H01L 29/267* | (2006.01) |
| *H01L 29/66* | (2006.01) |
| *H01L 29/778* | (2006.01) |
| *H01L 29/20* | (2006.01) |
| *H01L 29/10* | (2006.01) |

(52) U.S. Cl.
CPC ............ *H01L 29/432* (2013.01); *H01L 29/267* (2013.01); *H01L 29/66462* (2013.01); *H01L 29/7786* (2013.01); *H01L 29/1066* (2013.01); *H01L 29/2003* (2013.01)

(58) Field of Classification Search
CPC . H01L 29/432; H01L 29/7787; H01L 29/167; H01L 29/66462; H01L 29/267; H01L 29/1602; H01L 21/28264; H01L 29/78; H01L 21/283; H01L 29/2003
See application file for complete search history.

(56) References Cited

U.S. PATENT DOCUMENTS

| | | | |
|---|---|---|---|
| 2005/0146934 A1* | 7/2005 | Forbes | H01L 21/2807 365/185.12 |
| 2006/0060864 A1* | 3/2006 | Gerbi | H01L 21/0237 257/77 |
| 2009/0146186 A1* | 6/2009 | Kub et al. | 257/194 |
| 2010/0155900 A1* | 6/2010 | Korenstein et al. | 257/615 |
| 2010/0216301 A1* | 8/2010 | Chen | H01L 29/1602 438/604 |

(Continued)

OTHER PUBLICATIONS

R. Gaska, A. Osinsky, J.W. Yang, and M.S. Shur, "Self-Heating in High-Power AlGaN—GaN HFETs," IEEE Electron Dev. Lett. 19, pp. 89-91 (1998).

(Continued)

*Primary Examiner* — Jessica Stultz
*Assistant Examiner* — Mohammed R Alam
(74) *Attorney, Agent, or Firm* — US Naval Research Laboratory; Joslyn Barritt

(57) ABSTRACT

A field effect transistor having a diamond gate electrode and a process for forming the same. In some embodiments, the device is an AlGaN/GaN high-electron-mobility transistor (HEMT). The diamond gate electrode is formed so that it directly contacts the barrier layer. In some embodiments, the diamond gate electrode is formed from boron-doped nanocrystalline diamond (NCD), while in other embodiments, the diamond gate electrode is formed from single crystal diamond.

11 Claims, 4 Drawing Sheets

(56) References Cited

U.S. PATENT DOCUMENTS

2011/0005942 A1* 1/2011 Kohn et al. ............... 205/794.5
2011/0088456 A1* 4/2011 Ren et al. .................. 73/31.06

OTHER PUBLICATIONS

H.I. Fujishiro, N. Mikami, and M. Hatakenaka, "Monte Carlo study of self-heating effect in GaN/AlGaN HEMTs on sapphire, SIC, and Si substrates," Phys. Stat. Sol. (c) 2, No. 7, pp. 2696-2699 (2005).

M. Alomari, A. Dussaigne, D. Martin, N. Grandjean, C. Gaquiere, and E. Kohn, "AlGaN/GaN HEMT on (111) single crystalline diamond," Electron. Letters, vol. 46, 2010, pp. 299-301.

K.D. Chabak, J.K. Gillespie, V. Miller, A. Crespo, J. Roussos, M. Trejo, D.E. Walker, Jr., G.D. Via, G.H. Jessen, J. Wasserbauer, F. Faili, D.I. Babić, D. Francis, and F. Ejeckam, "Full-wafer characterization of AlGaN/GaN HEMTs on free-standing CVD diamond substrates," IEEE Electr. Dev. Lett., vol. 31, No. 2, pp. 99, 2010.

J.E. Butler and A.V. Sumant, "The CVD of nanodiamond materials," Chemical Vapor Deposition, 14, 145 (2008).

M. Seelman-Eggebert, P. Meisen, F. Schaudel, P. Koidl, A. Vescan, and H. Leier, "Heat-spreading diamond films for GaN-based high power transistors," Diamond and Relat. Mater. 10 (2001), pp. 744-749.

M. Alomari, M. Dipalo, S. Rossi, M.A. Diforte-Poisson, S. Delage, J.F. Carlin, N. Grandiean, C. Gaquiere, L. Toth, B. Pecz, and E. Kohn, "Diamond overgrown InAlN/GaN HEMTs," Diamond & Relat. Mater. 20, pp. 604-608 (2011).

M.J. Tadjer, T.J. Anderson, K.D. Hobart, T.I. Feygelson, J.D. Caldwell, C.R. Eddy, Jr., F.J. Kub, J.E. Butler, B.B. Pate, and J. Melngailis, "Reduced self-heating in AlGaN/GaN HEMTs using nanocrystalline diamond heat-spreading films," IEEE Electr. Dev. Lett. vol. 33, No. 1 (2012) pp. 23-25.

M.J. Tadjer, K.D. Hobart, J.D. Caldwell, J.E. Butler, K.X. Liu, C.R. Eddy, Jr, D.K. Gaskill, K.K. Lew, B.L. VanMil, R.L. Myers-Ward, M.G. Ancona, F.J. Kub, and T.I. Feygelson, "Nanocrystalline diamond films as UV-semitransparent Schottky contacts to 4H-SiC," Appl. Phys. Lett. 91, 163508 (2007).

M.J. Tadjer, T.I. Feygelson, K.D. Hobart, J.D. Caldwell, T.J. Anderson, J.E. Butler, C.R. Eddy, Jr., D.K. Gaskill, K.K. Lew, B.L. VanMil, R.L. Myers-Ward, F.J. Kub, G. Sollenberger, and L. Brillson, "On the high curvature coefficient rectifying behavior of nanocrystalline diamond heterojunctions to 4H—SiC," Appl. Phys. Lett. 97, 193510 (2010).

Y. Pei, K.J. Vampola, Z. Chen, R. Chu, S.P. DenBaars, and U.K. Mishra, "AlGaN/GaN HEMT With a Transparent Gate Electrode," IEEE Electron Device Lett. 30, pp. 439-441 (2009).

A. Wang, M. J. Tadjer, T. J. Anderson, R. Baranyai, J. W. Pomeroy, T. I. Feygelson, K. D. Hobart, B. B. Pate, F. Calle, and M. Kuball, "Impact of Intrinsic Stress in Diamond Capping Layers on the Electrical Behavior of AlGaN/GaN HEMTs," IEEE Transactions on Electron Devices, vol. 60, No. 10, Oct. 2013, 3149-3156.

I. Hwang, J. Kim, H.S. Choi, J. Lee, K.Y. Kim, J.-B. Park, J.C. Lee, J. Ha, J. Oh, J. Shin, U.I. Chung, "p-GaN gate HEMTs with Tungsten gate metal for high threshold voltage and low gate current," IEEE Electron Device Lett., vol. 34, No. 2, pp. 202-204, Feb. 2013.

T.R. Lenka and A.K. Panda, "Characteristics Study of 2DEG Transport Properties of AlGaN/GaN and AlGaAs/GaAs-based HEMT," Semiconductors, 2011, vol. 45, No. 5, pp. 650-656.

R.R. Pelá, C. Gaetano, M. Marques, L.G. Ferreira, J. Furthmüller, and L.K. Teles, "Accurate band gaps of AlGaN, InGaN, and AlInN alloys calculations based on LDA-1/2 approach," Applied Physics Letters 98, 151907 (2011).

* cited by examiner

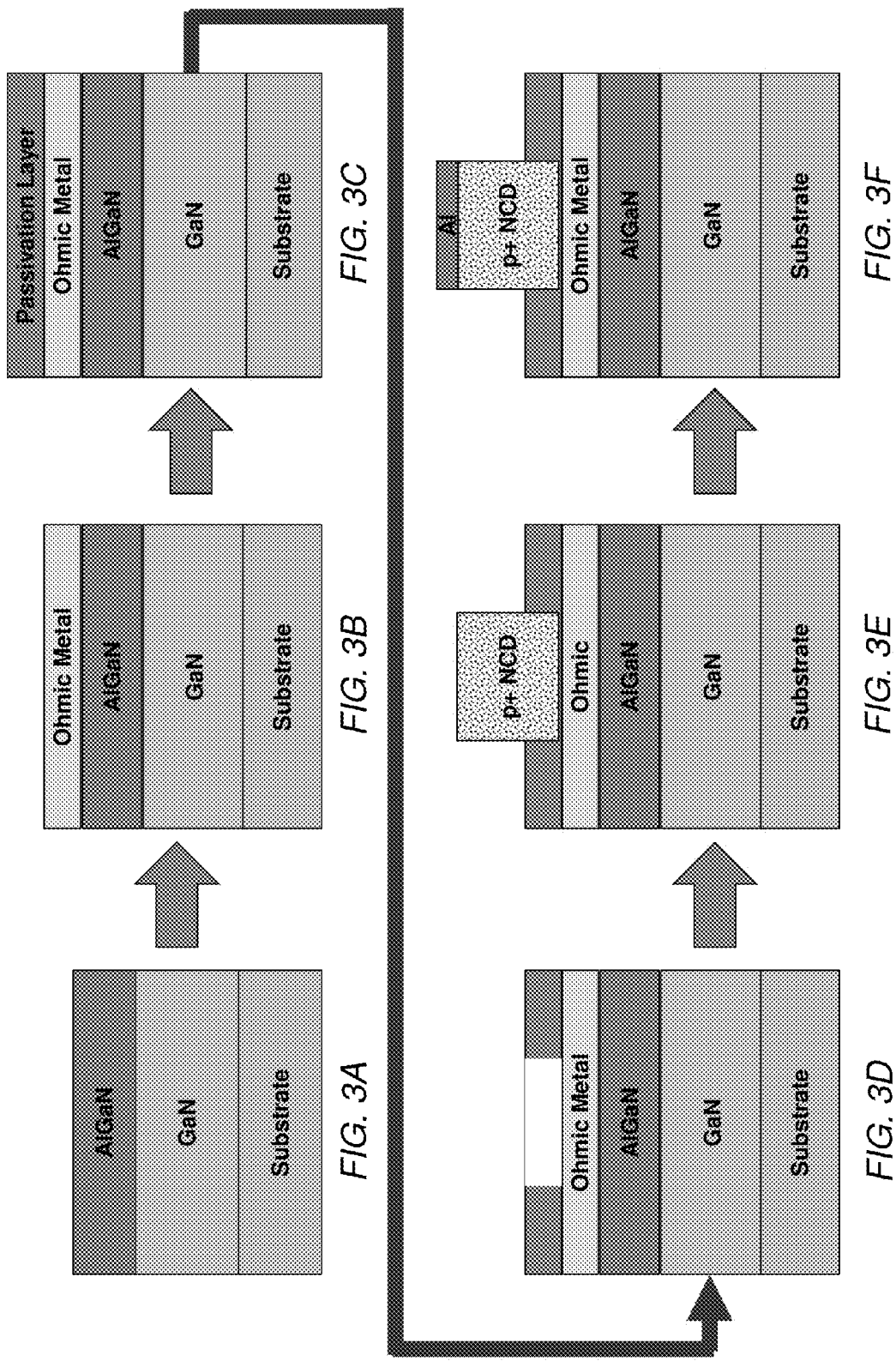

TRANSISTOR WITH DIAMOND GATE

CROSS-REFERENCE

This application is a non-provisional of, and claims the benefit of priority under 35 U.S.C. §119 based on, U.S. Provisional Patent Application No. 61/872,017 filed on Aug. 30, 2013, the entirety of which is hereby incorporated by reference into the present application.

TECHNICAL FIELD

The present invention relates to field effect transistors, particularly to the formation of a diamond gate electrode on a field effect transistor.

BACKGROUND

As a wide-bandgap semiconductor, GaN is attractive for next-generation high-efficiency power converter applications. The capabilities of GaN-based HEMTs to date have been limited by the self-heating effect, which has been well documented in the literature. See R. Gaska, A. Osinsky, J. W. Yang, and M. S. Shur, "Self-Heating in High-Power AlGaN-GaN HFETs," *IEEE Electron Dev. Lett.* 19, pp. 89-91 (1998); and H. I. Fujishiro, N. Mikami, and M. Hatakenaka, "Monte Carlo study of self-heating effect in GaN/AlGaN HEMTs on sapphire, SIC, and Si substrates," *Phys. Stat. Sol.* (c) 2, no. 7, pp. 2696-2699 (2005).

Diamond integration has been proposed as a technique to reduce self-heating, but backside approaches using diamond substrates are limited by sample size, availability, and coefficient of thermal expansion (CTE) mismatch. See M. Alomari, A. Dussaigne, D. Martin, N. Grandjean, C. Gaquiere, and E. Kohn, "AlGaN/GaN HEMT on (111) single crystalline diamond," *Electron. Letters*, vol. 46, 2010, pp. 299-301; and K. D. Chabak, J. K. Gillespie, V. Miller, A. Crespo, J. Roussos, M. Trejo, D. E. Walker, Jr., G. D. Via, G. H. Jessen, J. Wasserbauer, F. Faili, D. I. Babić, D. Francis, and F. Ejeckam, "Full-wafer characterization of AlGaN/GaN HEMTs on free-standing CVD diamond substrates," *IEEE Electr. Dev. Lett.*, vol. 31, no. 2, pp. 99, 2010. A scalable topside process, however, is enabled by the unique properties of nanocrystalline diamond (NCD) thin films, including high thermal conductivity, small grain size, and optical transparency. See J. E. Butler and A. V. Sumant, "The CVD of nanodiamond materials," *Chemical Vapor Deposition*, 14, 145 (2008).

A significant limitation to topside NCD approaches has been the lack of thermal stability of the Schottky gate. See M. Seelman-Eggebert, P. Meisen, F. Schaudel, P. Koidl, A. Vescan, and H. Leier, "Heat-spreading diamond films for GaN-based high power transistors," *Diamond and Relat. Mater.* 10 (2001), pp. 744-749; and M. Alomari, M. Dipalo, S. Rossi, M. A. Diforte-Poisson, S. Delage, J. F. Carlin, N. Grandiean, C. Gaquiere, L. Toth, B. Pecz, and E. Kohn, "Diamond over-grown InAlN/GaN HEMTs," *Diamond & Relat. Mater.* 20, pp. 604-608 (2011).

We have previously reported improved electrical performance and a 20% reduction in channel temperature with a "gate after diamond" process, which enables large-area, high thermal conductivity top-side diamond without damaging the Schottky gate. See M. J. Tadjer, T. J. Anderson, K. D. Hobart, T. I. Feygelson, J. D. Caldwell, C. R. Eddy, Jr., F. J. Kub, J. E. Butler, B. B. Pate, and J. Melngailis, "Reduced self-heating in AlGaN/GaN HEMTs using nanocrystalline diamond heat-spreading films," *IEEE Electr. Dev. Lett. Vol.* 33, no. 1 (2012) pp. 23-25.

An additional approach is to investigate thermally stable materials that can be used as the gate contact. While a metal Schottky contact is traditionally used as the gate material, the key requirement for a depletion-mode HEMT gate contact is low reverse leakage so that negative potential can be applied to turn off the device. Therefore any rectifying junction can serve this purpose.

NCD electrodes have been shown to form a rectifying contact to SiC. See M. J. Tadjer, K. D. Hobart, J. D. Caldwell, J. E. Butler, K. X. Liu, C. R. Eddy, Jr, D. K. Gaskill, K. K. Lew, B. L. VanMil, R. L. Myers-Ward, M. G. Ancona, F. J. Kub, and T. I. Feygelson, "Nanocrystalline diamond films as UV-semitransparent Schottky contacts to 4H-SiC," *Appl. Phys. Lett.* 91, 163508 (2007); and M. J. Tadjer, T. I. Feygelson, K. D. Hobart, J. D. Caldwell, T. J. Anderson, J. E. Butler, C. R. Eddy, Jr., D. K. Gaskill, K. K. Lew, B. L. VanMil, R. L. Myers-Ward, F. J. Kub, G. Sollenberger, and L. Brillson, "On the high curvature coefficient rectifying behavior of nanocrystalline diamond heterojunctions to 4H-SiC," *Appl. Phys. Lett.* 97, 193510 (2010).

Based on this model, it is expected that NCD will form a rectifying contact to AlGaN and wider-bandgap ternary nitrides. While indium tin oxide (ITO) has been demonstrated as a transparent gate contact, NCD films offer the additional advantages of high thermal conductivity and chemical and thermal stability. See Y. Pei, K. J. Vampola, Z. Chen, R. Chu, S. P. DenBaars, and U. K. Mishra, "AlGaN/GaN HEMT With a Transparent Gate Electrode," *IEEE Electron Device Lett.* 30, pp. 439-441 (2009).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a field effect transistor having a diamond gate electrode and a process for forming the same.

In some embodiments, a device in accordance with the present invention includes an AlGaN/GaN high-electron-mobility transistor (HEMT).

In some embodiments, the diamond gate electrode is formed from p+-doped nanocrystalline diamond (NCD), while in other embodiments, the diamond gate electrode is formed from single crystal diamond.

In some embodiments, the p+-doped NCD is doped with boron.

In some embodiments, the diamond gate is capped with a layer of metal that can serve as a mask for subsequent patterning of the diamond gate.

A process for forming a transistor having a diamond gate includes the steps of forming a transistor wafer, e.g., an AlGaN/GaN HEMT, on a substrate, depositing an ohmic metal on the surface of the GaN barrier layer, patterning the ohmic metal to form an opening for the gate, and forming the diamond gate, e.g., by growing p+-doped NCD on the gate contact region.

The presence of a diamond material gate in a transistor in accordance with the present invention can provide improved thermal management in the device, as well as providing improved performance, power handling, reliability, and thermal stability. Such properties can enable the devices to be used in a wide range of applications at temperatures up to, and even exceeding, 300° C.

BRIEF DESCRIPTION OF THE DRAWINGS

FIGS. 3A-3F illustrate aspects of an exemplary process for forming an AlGaN-GaN HEMT having a doped diamond gate in accordance with the present invention.

DETAILED DESCRIPTION

Figure 1:
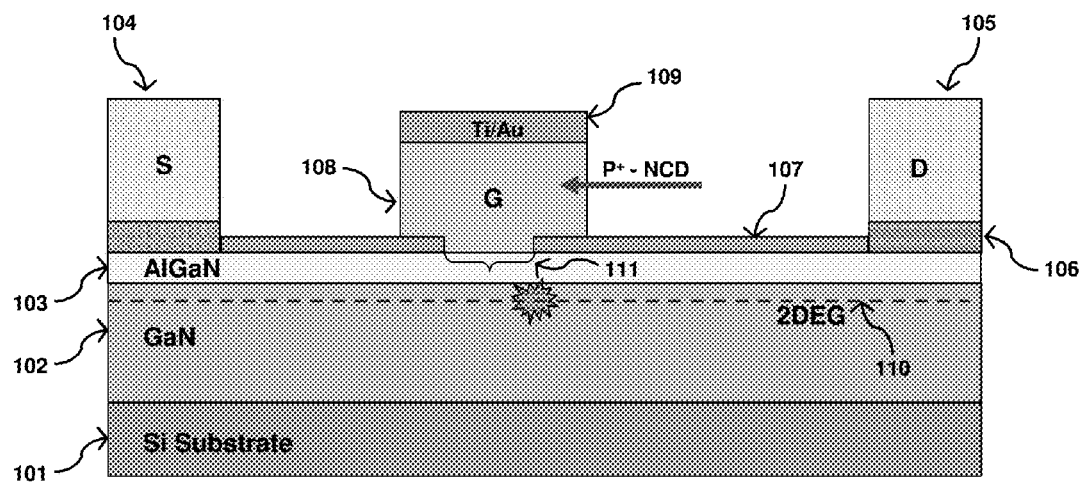
FIG. 1 is a block diagram illustrating aspects of an exemplary embodiment of an AlGaN-GaN HEMT having a doped diamond gate in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a field effect transistor having a diamond gate electrode and a process for forming the same.

As used herein, the terms "buffer layer" and "barrier layer" have the following meanings with respect to a field effect transistor device having a diamond gate in accordance with the present invention.

Buffer layer: The buffer layer, often referred to as a "buffer/transport" layer, comprises one or more epitaxial layers, for example, GaN buffer layer 102 shown in FIG. 1, which is disposed above the substrate in the gate region of the transistor and in at least portions of the source or drain regions and makes a heterointerface with the bottom side of the barrier layer (i.e., the side of the barrier layer that is closest to the substrate). The buffer layer contains a two-dimensional electron gas (2DEG) near the interface between the buffer layer and the barrier layer, which is the conductive channel carrying electrons from the source to the drain. The buffer layer can be formed from one or more different III-nitride materials, which can be intentionally or unintentionally doped, with materials that are unintentionally doped being typically N-type.

Barrier layer: The barrier layer comprises one or more epitaxial layers disposed above the buffer layer, for example, AlGaN layer 103 shown in FIG. 1. The materials for the barrier layer can be selected to induce spontaneous polarization and/or piezoelectric polarization at a heterointerface that can enhance or reduce the carrier density of fixed positive polarization charge which induces the 2DEG in the buffer/transport layer. In some embodiments, the barrier layer can further include a thin epitaxial III-Nitride spacer layer such as a 1 nm thick AlN spacer layer, while in other embodiments, the barrier layer can include an epitaxial layer that can serve as an etch stop layer.

In operation, a field effect transistor such as an AlGaN-GaN high electron mobility transistor (HEMT) can exhibit significant heating caused by an increase in the electric field, with the greatest amount of heat being generated in the buffer/transport layer at the point just below the gate at the drain side of the gate. Such localized Joule heating increases carrier scattering, reducing 2DEG mobility, increases leakage currents, and decreases reliability.

Consequently, it is desirable to manage the heating of the device, not only in general but in particular at the point in the buffer/transport layer just below the drain side of the gate opening.

Diamond is an optically transparent material that has a high degree of thermal conductivity, making it a desirable material for thermal management in electrical devices. In addition, diamond has a very wide bandgap and can be heavily doped, giving it a very low sheet resistance. Thus, using diamond as a gate material can provide significantly improved thermal management in a transistor by providing a highly thermally conductive, electrically conductive material in close proximity to the source of the heat generated in the device.

FIG. 1 is a block diagram illustrating an exemplary embodiment of a diamond-gated transistor device in accordance with the present invention, comprising an AlGaN-GaN high-electron-mobility transistor (HEMT) having a p+-doped nanocrystalline diamond (NCD) gate.

Thus, as illustrated in FIG. 1, such a device can include a substrate such as Si substrate 101, a GaN buffer/transport layer 102 disposed on the substrate and AlGaN barrier layer 103 disposed on the GaN buffer layer 102. GaN buffer/transport layer 102 has a two-dimensional electron gas (2DEG) 110 distributed therein, where mobile electrons are confined, and this 2DEG is the conductive channel between the source and drain of the transistor. The device further includes an ohmic metal layer 106 deposited on the surface of the AlGaN and annealed to provide an electrical contact for the source and the drain, and in some embodiments, also includes a SiN layer 107 to provide passivation for the device.

Ohmic metal layer 106 and passivation layer 107 are patterned to provide a contact window for formation of the source 104 and drain 105, e.g., by depositing metal then optionally performing a rapid thermal anneal. Ohmic metal layer 106 and passivation layer 107 also have an opening 111 for gate 108 formed therein, the gate opening being formed by, e.g., etching the passivation layer by $SF_6$-based reactive ion etch (RIE).

In accordance with the present invention, gate 108 is formed from a diamond material.

In some embodiments, gate 108 is formed from NCD which has been p+-doped, e.g., with boron, while in others, it is formed from a doped single crystal diamond. The diamond gate material can be capped with a layer of metal such as Ti/Al layer 109 to serve as a mask for subsequent patterning of the diamond, with the metal layer remaining in place in some embodiments to provide reduced gate pad resistance.

In some embodiments, diamond gate 108 can be formed so that it is placed in direct contact with the buffer layer where the conductive channel is formed, without an intervening barrier layer or gate insulator. In such cases, as noted above, the doping profile of the diamond gate can be engineered so that the diamond material that is near the diamond/semiconductor channel material interface has a sufficiently low level of doping that the diamond serves as a gate insulator.

Figure 2:
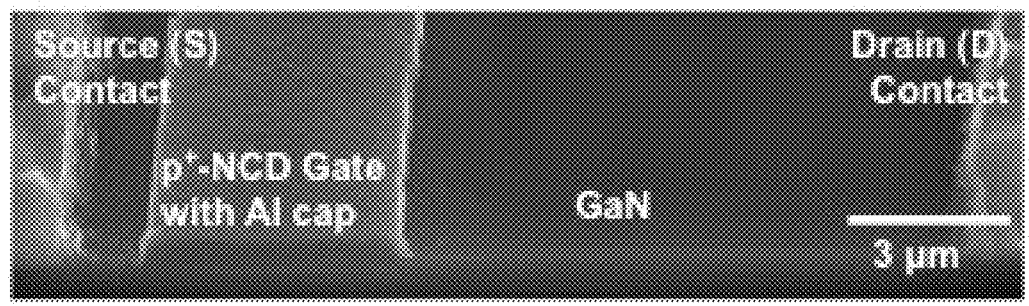
FIG. 2 is a focused ion beam (FIB) image showing a cross-section of an exemplary HEMT device having a diamond gate fabricated in accordance with the present invention.

For example, in the AlGaN/GaN HEMT application, implementing a diamond gate electrode with high p-type doping near the AlGaN/diamond interface can facilitate "normally-off" or enhancement mode operation by creating a p-n junction depletion region, which extends to the two-dimensional electron gas (2DEG). Therefore, when no bias is applied to the gate electrode, the 2DEG is depleted of carriers, making the channel discontinuous, therefore preventing the flow of electrons from the source to the drain FIG. 2 is a focused ion beam (FIB) image showing a cross-section of an exemplary HEMT device having a diamond gate fabricated in accordance with the present invention, where the device is an AlGaN/GaN HEMT having a gate length ($L_G$) of 3 μm, source-drain spacing ($L_{SD}$) of 20 μm, and gate width ($W_G$) of 100 μm. In the embodiment shown in FIG. 2, the gate is formed from p+ NCD etched with a Ti/Al mask, with the mask remaining in place for reduced gate pad resistance.

As described in more detail below, the presence of a diamond material gate in a transistor in accordance with the present invention can provide improved thermal management in the device, as well as providing improved current-voltage characteristics, power handling, reliability, and thermal stability. Such properties can enable the devices to be used in a wide range of applications at temperatures up to, and even exceeding, 300° C.

As noted above, the present invention also includes a process for forming a semiconductor device having a p+ NCD gate electrode. It will be noted that although the process is described below in the context of an AlGaN/GaN HEMT, the process steps—and challenges described below in growing a p+ doped diamond gate electrode—are applicable to the formation of a diamond gate on any semiconductor device.

Previous attempts to form such a gate electrode on a semiconductor device have not previously been successful. Forming a p+ NCD gate electrode requires an addition thin film deposition, and growing p+ NCD diamond on a semiconductor is very difficult to achieve. Challenges in doing so include effective NCD seeding, nucleation, growth, and doping on the semiconductor surface, as well as patterning and etching of the NCD film for implementation as a gate electrode. The interface between the NCD and the semiconductor surface must be optimized to reduce the number of interface states and in addition, must have a doping density near the interface for optimized gate control. Furthermore, any un-doped NCD layer existing between the p+ NCD and the III-nitride material will act as a gate dielectric, resulting in a large threshold voltage shift, so doping of the NCD material must be very carefully achieved.

The inventors of the present invention were able to overcome these difficulties to provide a method for forming an AlGaN/GaN HEMT having a p+ NCD gate electrode in accordance with the present invention.

In an exemplary embodiment, such a process can include the following steps, aspects of which are illustrated in FIGS. 3A-3F:

As illustrated in FIG. 3A, the process starts with a wafer with a GaN buffer layer and an AlGaN barrier layer disposed on the GaN buffer layer. Device isolation is performed on the wafer, e.g., by forming a mesa using $Cl_2$-based inductively coupled plasma (ICP) etching or by performing oxygen or ion implant isolation.

In a next step, illustrated in FIG. 3B, an ohmic metal such as Ti/Al/Ni/Au is deposited on the surface of the AlGaN barrier, optionally via e-bean evaporation. The ohmic metal can then be patterned, e.g., using lift-off or etch back, and in some embodiments can be annealed, e.g., using rapid thermal annealing (RTA).

In some embodiments, a layer such as a silicon nitride, an aluminum nitride layer, or a diamond layer is then deposited on the AlGaN barrier layer to serve as surface passivation for the device, as illustrated in FIG. 3C. As shown in FIG. 3D, gate openings in the passivation layer can then be defined, e.g., by etching the passivation layer by SF6-based reactive ion etch (RIE).

In a next step, illustrated in FIG. 3E, p-type boron-doped NCD is grown over the surface of the passivation layer, using seeding and growth methods known in the art. See Chabak, supra, and Butler, supra. See also I. Hwang, J. Kim, H. S. Choi, J. Lee, K. Y. Kim, J.-B. Park, J. C. Lee, J. Ha, J. Oh, J. Shin, U. I. Chung, "p-GaN gate HEMTs with Tungsten gate metal for high threshold voltage and low gate current," *IEEE Electron Device Lett.*, vol. 34, no. 2, pp. 202-204, Feb. 2013. In some embodiments, the NCD is grown over the entire device while in other embodiments, such as that illustrated in FIG. 3E, the NCD can be grown selectively over only desired portions of the device, e.g., only in the gate contact region. Whether the diamond is grown on passivation layer or directly on the barrier layer, the doping in the diamond is optimized so that the dopant is incorporated in the diamond very close to the nucleation interface between the diamond and the semiconductor surface. In either case, as noted above, growth of diamond on a semiconductor is very difficult to achieve, as is the optimized doping necessary for the diamond to operate as a gate, and these aspects of the present invention were only obtained after significant work by the inventors of the present invention.

In addition, in some embodiments, as illustrated in FIG. 3F, a metal layer such as the Al layer shown in the FIGURE can be deposited on the NCD, e.g., via e-beam evaporation, and with the Al layer and the diamond then being patterned to define the NCD gate electrode feature of the HEMT. In some embodiments, metal patterning can be done by wet chemical etching or lift-off, followed by $O_2$-based ICP etching to pattern the NCD electrode while in other embodiments, patterning can be done by masking the diamond with a dielectric material such as SiO2 or SiNx which are patterned by wet chemical etching or fluorine-based plasma etching followed by O2-based ICP etching to pattern the NCD electrode. In some embodiments, the mask can be left in place and used as a self-aligned gate contact, while in other embodiments, the mask can be removed after the diamond etching step.

EXAMPLES

Conventional Schottky-gated HEMTs having a Ni/Au gate and NCD-gated HEMTs in accordance with the present invention were fabricated from the same AlGaN/GaN HEMT wafer consisting of an 18-nm $Al_{0.27}Ga_{0.73}N$ barrier on an 800-nm GaN buffer layer disposed on a Si substrate. The conventional device and the device in accordance with the present invention were fabricated using the same process sequence until gate electrode deposition, at which point the processes for the two devices differed, as described below. Mesa isolation was performed using $Cl_2$-based inductively coupled plasma (ICP) etching.

Ohmic metal was deposited via e-beam evaporation of Ti/Al//Ni/Au and patterned using liftoff, followed by rapid thermal annealing. The devices were then passivated by 50-nm plasma-enhanced chemical vapor deposition $SiN_x$.

Gate openings were etched in the passivation layer by an $SF_6$-based reactive ion etch step. The gate length ($L_G$) was 3 μm, source-drain spacing ($L_{SD}$) was 20 μm, and gate width ($W_G$) was 100 μm.

The Ni/Au gate was formed and patterned by e-beam evaporation followed by liftoff, in a manner well known by those skilled in the art.

To form the NCD gate in the device according to the present invention, a conformal 500-nm layer of p-type boron-doped NCD ($R_{SH}$=400 Ω/□, $N_A$=7.5×1019 $cm^{-3}$) was grown over the entire sample using conventional diamond seeding and growth methods such as those described in Chabak, Butler, and Wang, supra. The NCD film was patterned into the gate by $O_2$-based ICP etching, using Al as a hard mask, with the Al film being patterned by etch back and left in place after the NCD etch to serve as a self-aligned ohmic contact to the NCD layer. A $SiN_x$ passivation layer served as an etch stop for the NCD etch.

The devices were initially characterized via Hall measurements taken on a 150-$μm^2$ gated van der Pauw pattern fabricated simultaneously with the devices to monitor for damage to the gate region during NCD growth. Such damage is a concern because the AlGaN surface is exposed to the harsh deposition conditions (750° C. $H_2/CH_4$ atmosphere, 600-W microwave plasma) during the preliminary stages of growth.

TABLE I below shows a comparison of relevant device parameters for the conventional Ni/Au-gated device and NCD-gated device in accordance with the present invention.

TABLE I

| Parameter | Units | Ni/Au Gate | NCD Gate |
|---|---|---|---|
| $μ_{2DEG}$ | $cm^2$ (V · s) | 1220 | 1280 |
| $n_s$ | $cm^{-2}$ | 8.92 × $10^{12}$ | 1.02 × $10^{13}$ |
| $R_{SH}$ | Ω/□ | 533 | 478 |
| $R_{ON}$ | Ω-mm | 29.4 | 12.1 |
| $I_{DSS}$ ($V_G$ = 0 V) | A/mm | 0.198 | 0.217 |
| $I_{OFF}$ ($V_G$ = −10 V) | A/mm | 1.55 × $10^{-4}$ | 9.12 × $10^{-6}$ |
| $V_T$ | V | −1.26 | −2.91 |
| $g_{m,MAX}$ | mS/mm | 142 | 111 |

Hall measurements indicated an increase in the 2-D electron gas (2DEG) density in the NCD-gated device in accordance with the present invention as compared to the device having a conventional Ni/Au gate in accordance with the prior art. This effect could be attributed to additional tensile strain induced in the structure from the presence of the NCD and $SiN_x$ layers. See Tadjer 2012, supra, and Wang, supra.

In addition, as can be seen from Table I, the boron-doped NCD-gated devices in accordance with the present invention exhibited a lower sheet resistance $R_{SH}$ and a lower ON-resistance $R_{ON}$ as compared to the conventional devices, as well as a higher ON-state drain current $I_{DSS}$ and a lower gate leakage current $I_{OFF}$. Also, the gate can be driven further into accumulation, increasing the maximum drain current, as well as facilitating enhancement mode operation of the device.

Figure 4A:
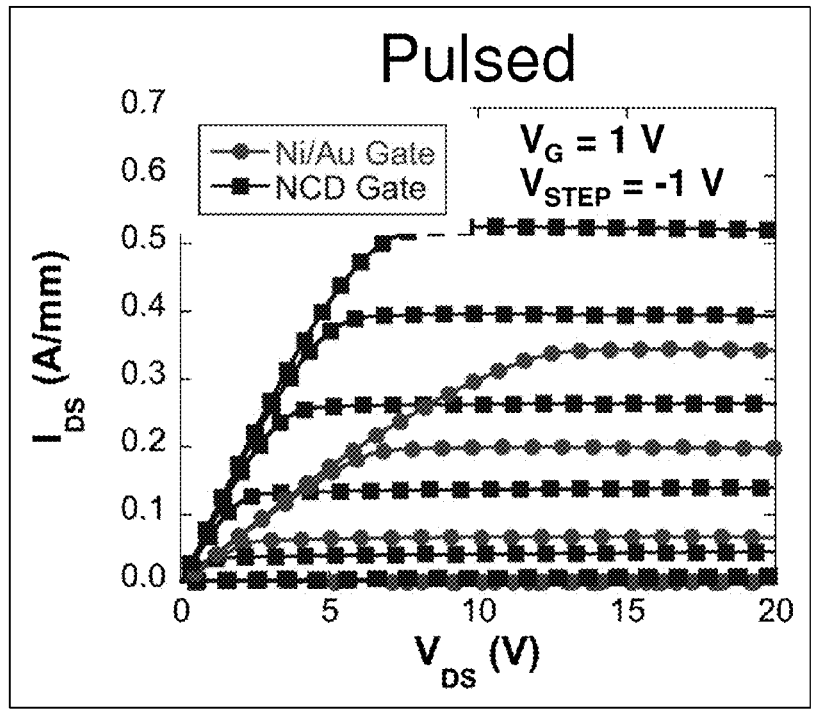
FIGS. 4A and 4B contain plots illustrating pulsed (FIG. 4A) and static (FIG. 4B) $V_{DS}$-$I_D$ characteristics for a conventional Ni/Au-gated device and an NCD-gated device in accordance with the present invention.
Figure 4B:
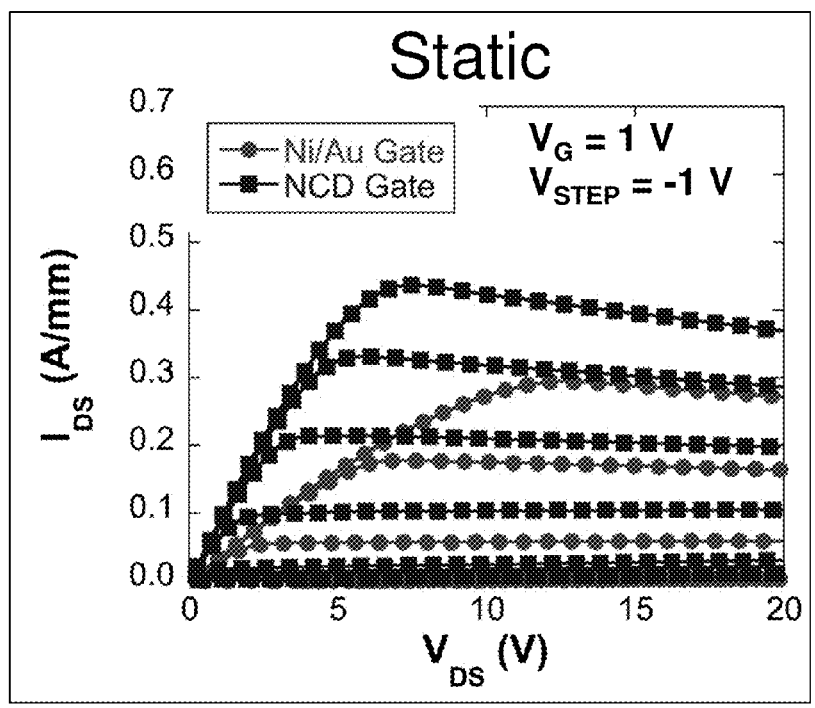

The pulsed and dc (static) I-V behavior of both each device was characterized using a HP4145 parameter analyzer and an Accent Dynamic I-V Analyzer D265EP with a pulsewidth of 200 ns and a pulse separation of 1 ms with $V_{DS,Q}$=20 V, $V_{GS,Q}$=−5 V. FIGS. 4A and 4B, respectively, show the $V_{DS}$-$I_{DS}$ curves for the Ni/Au- and NCD-gated devices under examination, where the results for a conventional Ni/Au-gated device are shown by circles and the results for an NCD-gated device in accordance with the present invention are shown by squares.

As can be seen from the plots in FIGS. 4A and 4B, the NCD-gated device in accordance with the present invention exhibits a nearly 50% increase in $I_{DS}$ at $V_{GS}$=0 V, along with a decrease in ON-resistance, for both pulsed and static measurements. The large increase in $I_{DS}$ is a result of the higher overdrive voltage at $V_G$=0 V, where the 10% increase in 2DEG density is expected from the aforementioned SiNx layer in the access regions and tensile stress from NCD under the gate. The pulsed $V_{DS}$-$I_D$ sweeps shown in the plots in FIG. 3A, indicate reduced current collapse in the NCD-gated device, quantified by comparing the ratio of dc to pulsed current density. The ratio was 85% for the NCD-gate device but only 70% for the reference device. This implies that there is no additional trapping under the gate as a result of the diamond deposition process and that the NCD growth process improved the $SiN_x$ passivation in the access regions by annealing the film in a hydrogen-rich atmosphere.

Figure 5:
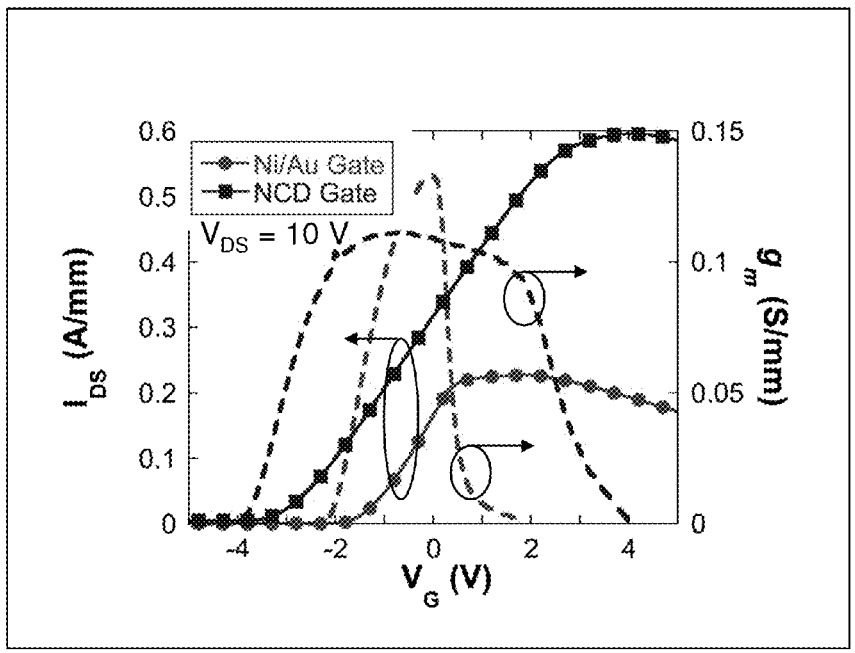
FIG. 5 contains plots illustrating drain current versus gate voltage characteristics for a conventional Ni/Au-gated device and a boron-doped NCD-gated device in accordance with the present invention.

The plots in FIG. 5 show the results of a $V_{GS}$-$I_{DS}$ sweep for the conventional Ni/Au-gated device and the NCD-gated device in accordance with the present invention. As can be seen from the plots in FIG.5, the NCD-gated HEMT can be driven to the saturation region at a static $V_{GS}$=5 V, whereas the Ni/Au-gated HEMT is limited to the linear region at $V_{GS}$=2 V when the turn-ON of the Schottky gate begins to limit $I_{DS}$.

Figure 6:
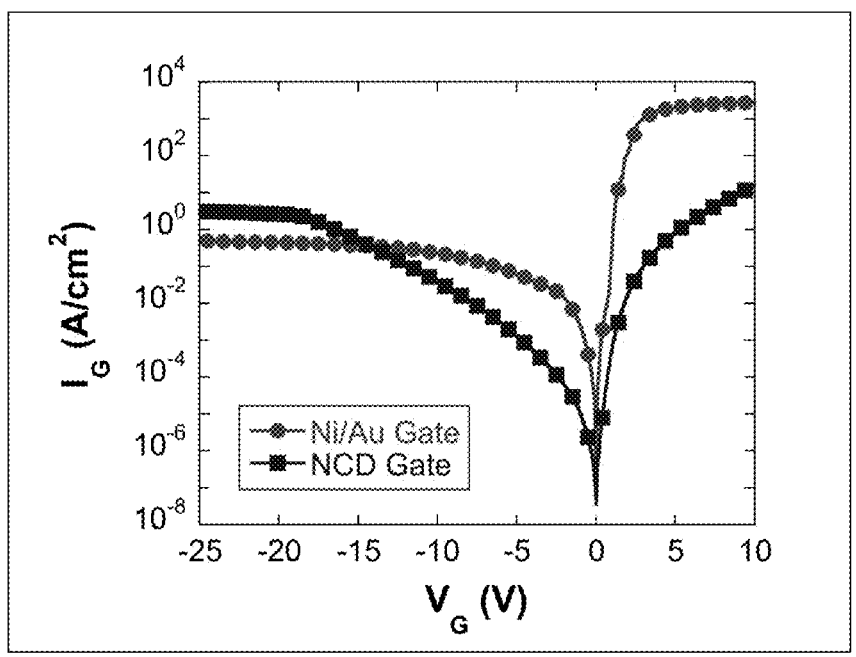
FIG. 6 contains plots illustrating gate current versus gate voltage characteristics for a conventional Ni/Au-gated device and a boron-doped NCD-gated device in accordance with the present invention.

The gate leakage current in an NCD-gated HEMT in accordance with the present invention is governed by the NCD-AlGaN heterojunction. The diode I-V characteristics for this junction for the Ni/Au-gated and boron-doped NCD-gated devices are shown in FIG. 6. As can be seen from the plots in FIG. 6, a boron-doped NCD-gated device in accordance with the present invention exhibits a significantly improved threshold voltage exhibits a low reverse leakage current, and a large turn on voltage offset as compared to the conventional Ni/Au-gated device. This enables forward biasing of the gate contact to 10 V while maintaining low gate leakage, a limitation of Schottky-gated HEMTs for enhancement-mode operation.

Thus, as can be seen from the results described above, the inventors herein demonstrated a boron-doped NCD-gated AlGaN/GaN HEMT, and demonstrated that such a HEMT provides improved performance over that exhibited by a conventional Ni/Au-gated device. The current density in the device is two times higher than that of Ni/Au-gated reference HEMTs at the same gate voltage, and the presence of an interfacial layer of lightly doped NCD results in a −1.65 V $V_T$ shift.

Advantages and New Features

NCD-gated HEMTs in accordance with the present invention implement heat-spreading layers in direct contact with the heat source, thereby providing improved thermal management in devices in which such NCD gates are implemented. Use of diamond gate electrodes in accordance with the present invention will provide improved mitigation of the self-heating effects experienced by high-electron mobility transistors, and can facilitate enhancement mode operation of such devices by depleting the 2DEG under the gate with proper doping location/density Such improved thermal management can enable the devices to be used in a wide range of high-temperature applications such as oil and geothermal well down-hole drilling, space exploration, power electronics, and aircraft and automotive applications.

In addition, the chemical and thermal stabilities of NCD offer potential for integration with additional heat spreading layers such as electrically non-conductive NCD heat-spreading layers.

Moreover, the use of diamond as a gate electrode in accordance with the present invention creates additional strain due to thermal and lattice mismatch between NCD and the AlGaN barrier, which can enhance sheet carrier concentration and carrier mobility in the device.

The use of diamond also results in an optically transparent electrode, which enables top down optical characterization through the gate electrode, e.g., through Raman measurements to determine 2DEG channel temperature.

Alternatives

In addition, while particular embodiments, aspects, and features have been described and illustrated, it should be noted that the invention described herein is not limited to only those embodiments, aspects, and features, and it should be readily appreciated that modifications may be made by persons skilled in the art.

For example, although the diamond used for the gate in accordance with the present invention is typically p+ NCD doped with boron, in other embodiments, other dopants such as potassium, sodium, and aluminum can be used to obtain p+-doped NCD.

In still other embodiments, single crystal diamond can be used for the gate instead of NCD.

In some embodiments, the passivation layer can be formed from aluminum nitride, diamond, aluminum oxide, gallium oxide, hafnium oxide, silicon oxide, BCB, or other dielectrics.

In some embodiments, regrown n+III-nitride contacts could be implemented for the source and drain.

Finally, although the present invention has been described in the context of an AlGaN-GaN HEMT, in other embodiments, a diamond gate can be implemented on other transistor devices such as MOSFETs, MODFETs, and JFETs from other III-nitride materials, Si, graphene, carbon nanotubes, semiconductor nanowires, etc.

These and any and all other modifications within the spirit and scope of the underlying invention described and claimed herein are contemplated by the present application, and all such embodiments are within the scope and spirit of the present disclosure.

What is claimed is:

1. A semiconductor device, comprising:
    a buffer layer disposed on a substrate, the buffer layer having a first bandgap and being configured to provide electron transport to a source and a drain in the device;
    a barrier layer disposed on the buffer layer, the barrier layer having a second bandgap, the second bandgap being wider than the first bandgap; and
    a source electrode, a drain electrode, and a gate electrode formed on the barrier layer;
    the gate electrode being a diamond gate electrode formed from diamond material grown directly on an upper surface of the barrier layer;
    wherein at least a portion of the diamond material is in direct contact with the barrier layer.

2. The semiconductor device according to claim 1, wherein the diamond material is p+-doped nanocrystalline diamond (NCD).

3. The semiconductor device according to claim 2, wherein the p+-doped NCD is doped with one of boron, potassium, sodium, or aluminum.

4. The semiconductor device according to claim 1, wherein the diamond material is single-crystal diamond.

5. The semiconductor device according to claim 1, wherein the device is an AlGaN/GaN high-electron mobility transport (HEMT) device having an AlGaN barrier layer and a GaN buffer layer.

6. The semiconductor device according to claim 1, wherein the device is a MOSFET, a MODFET, or a JFET.

7. The semiconductor device according to claim 1, wherein the device is formed from at least one III-nitride semiconductor material.

8. The semiconductor device according to claim 1, wherein at least one of the layers is formed from silicon, graphene, carbon nanotubes, or semiconductor nanowires.

9. The semiconductor device according to claim 1, further comprising a passivation layer deposited on the barrier layer, the passivation layer being patterned to provide an opening for formation of the diamond gate electrode such that the diamond gate is grown directly on the upper surface of the barrier layer.

10. The semiconductor device according to claim 1, further comprising an electrically conductive cap deposited on an upper surface of the diamond gate electrode.

11. The semiconductor device according to claim 10, wherein the electrically conductive cap comprises Ti/Au.

* * * * *